(12) United States Patent
Kim et al.

(10) Patent No.: US 8,581,207 B2
(45) Date of Patent: Nov. 12, 2013

(54) SPECIMEN HOLDER WITH 3-AXIS MOVEMENT FOR TEM 3D ANALYSIS

(75) Inventors: Youn-Joong Kim, Daejeon (KR); Jong-Man Jeung, Daejeon (KR)

(73) Assignee: Korea Basic Science Institute, Daejeon (KR)

( * ) Notice: Subject to any disclaimer, the term of this patent is extended or adjusted under 35 U.S.C. 154(b) by 597 days.

(21) Appl. No.: 12/957,102

(22) Filed: Nov. 30, 2010

(65) Prior Publication Data
US 2012/0119109 A1 May 17, 2012

(30) Foreign Application Priority Data
Nov. 17, 2010 (JP) ................... 2010-256958

(51) Int. Cl.
*H01J 37/20* (2006.01)
(52) U.S. Cl.
CPC ..................... *H01J 37/20* (2013.01)
USPC .................................................. 250/442.11
(58) Field of Classification Search
CPC .............. H01J 2237/202; H01J 2237/20207; H01J 2237/20214; H01J 2237/20221; H01J 37/20
USPC ..................................................... 250/442.11
See application file for complete search history.

(56) References Cited

U.S. PATENT DOCUMENTS

| | | | | |
|---|---|---|---|---|
| 3,727,051 A | * | 4/1973 | Page | .............................. 250/311 |
| 3,745,341 A | | 7/1973 | Sakitani | |
| 3,778,621 A | * | 12/1973 | Mikajiri | .................... 250/442.11 |
| 5,153,434 A | | 10/1992 | Yajima et al. | |
| 5,264,705 A | | 11/1993 | Honda et al. | |
| 6,388,262 B1 | * | 5/2002 | Alani et al. | .............. 250/442.11 |
| 6,410,925 B1 | | 6/2002 | Armbruster et al. | |
| 6,669,121 B2 | * | 12/2003 | Kasai | ........................ 250/442.11 |
| 2009/0127474 A1 | | 5/2009 | Tsuneta et al. | |
| 2010/0230584 A1 | * | 9/2010 | Niebel et al. | ................ 250/252.1 |

FOREIGN PATENT DOCUMENTS

| | | |
|---|---|---|
| EP | 0456219 A2 | 11/1991 |
| JP | 62-177844 A | 8/1987 |
| JP | 05013033 A | 1/1993 |
| JP | 2001-066231 A | 3/2001 |
| JP | 2007-179805 A | 7/2007 |
| WO | 00/10191 A1 | 2/2000 |

OTHER PUBLICATIONS

Search Report for Application No. GB1113651.2, dated Dec. 8, 2011.
Search Report for German Application No. 10 2011 081 410.8, dated Mar. 16, 2012.
Search Report for Application No. GB 2007649, dated Dec. 19, 2012.

* cited by examiner

*Primary Examiner* — Jack Berman
(74) *Attorney, Agent, or Firm* — Edwards Wildman Palmer LLP

(57) ABSTRACT

Provided is a holder capable of a precise observation from 3 or more directions to analyze complicated internal structures of a specimen thereof, and more particularly, a specimen holder capable of a 3-axis movement for transmission electron microscope (TEM) 3D analysis that rotates cradles for supporting the specimen and moves the cradles back and forth and left and right, and freely changes directions of the specimen, thereby making it possible to more accurately analyze the specimen in three dimensions.

14 Claims, 11 Drawing Sheets

SPECIMEN HOLDER WITH 3-AXIS MOVEMENT FOR TEM 3D ANALYSIS

CROSS-REFERENCE TO RELATED APPLICATION

This application claims under 35 U.S.C. §119(a) the benefit of Japanese Application No. 2010-256958 filed Nov. 17, 2010, the entire contents of which are incorporated herein by reference.

BACKGROUND

1. Technical Field

The present invention relates to a specimen holder of a transmission electron microscope (TEM) capable of observing a specimen from 3 or more directions, and more particularly to, a specimen holder capable of 3-axis movement for TEM 3D analysis that is able to more accurately analyze the specimen by moving the observation point of the specimen to the center of the rotational axis, and by making the specimen rotated and tilted.

2. Description of the Related Art

To analyze the internal structure of a material by using TEM, a circular specimen having a diameter of about 3 mm through which an electron beampasses is prepared. The prepared specimen is mounted in a holder suitable for the analytical purpose, and the holder is inserted into the TEM.

Holders used in the TEM are classified as tilt holders, rotation holders, heating holders, cooling holders, and cryo-transfer holders according to the characteristics of holders. A specimen must be observed in various directions in order to analyze the internal structure of a material by using the TEM holder.

Holders having free tilting are used to analyze the specimen in various directions. These holders can be tilted by ±30° at maximum, and particularly up to by ±70° according to the gap of pole pieces of the TEM.

A specimen cradle is tilted for the tilting holder of ±30°. In case of tilting more than ±30°, a specimen is not easily observed due to the thickness of the specimen cradle itself. The tilting holder of ±70° has to use the holder tilting, which is possible for the TEM having a large pole-piece gap and a goniometer capable of high-angle tilting.

A double tilt holder manufactured to observe the specimen in various directions has advantage to use both the specimen cradle tilting (±30°) and the holder tilting (±70°), but has disadvantage difficult to analyze other orientations than these two tilting axes.

To solve this disadvantage, a rotation holder is manufactured. The rotation holder can rotate and observe all directions of the specimen when the observation point of the specimen is on the right center of the rotation axis. However, if the observation point is not located at the center of the rotation axis, it is easily moved beyond the field of view when the specimen cradle is rotated or the holder is tilted. At high magnification of TEM it is not easy to move the observation point into the field of view. Although the observation point is moved within the field of view, it is very difficult to perform 3D analysis by combining the images observed in various orientations, since a status in which the specimen is disposed is easily changed by the movement.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The present invention provides a specimen holder capable of 3-axis movement for 3D analysis using a transmission electron microscope (TEM) that freely changes directions of the specimen and more accurately analyze the specimen in 3 dimensions.

In particular, the present holder has developed to solve the disadvantages of the conventional double tilt holder or rotation holder. This holder provides observation of the specimen in various orientations by horizontally moving the specimen cradle and locating the observation point on the center of the rotation axis, and then rotating the specimen cradle or tilting the holder.

According to an embodiment of the present invention, the specimen holder includes a holder head in which a specimen is to be mounted; and a control part that is configured to move the mounted specimen.

The holder head comprises upper and lower cradles, a rotation gear, a rotation driving gear, a gear cover, and a rack moving gear. The upper and lower cradles are installed in a cradle placement hole formed in a head body of the holder head and are configured to support the specimen. The rotation gear is installed between the upper and lower cradles and is configured to rotate the upper and lower cradles. The rotation driving gear is welded to the rotation gear and is configured to rotate the rotation gear. The gear cover is movably installed horizontally on the upper portion of the upper cradle. The rack moving gear is welded to a rack gear installed in the gear cover and is configured to drive the rack gear to thereby allow the gear cover to move in perpendicular to a length direction of the head body.

The control part comprises: a cradle rotation means that is configured to rotate the rotation driving gear; and back and forth and left and right moving means that horizontally move the upper and lower cradles.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE DISCLOSURE

Figure 1:
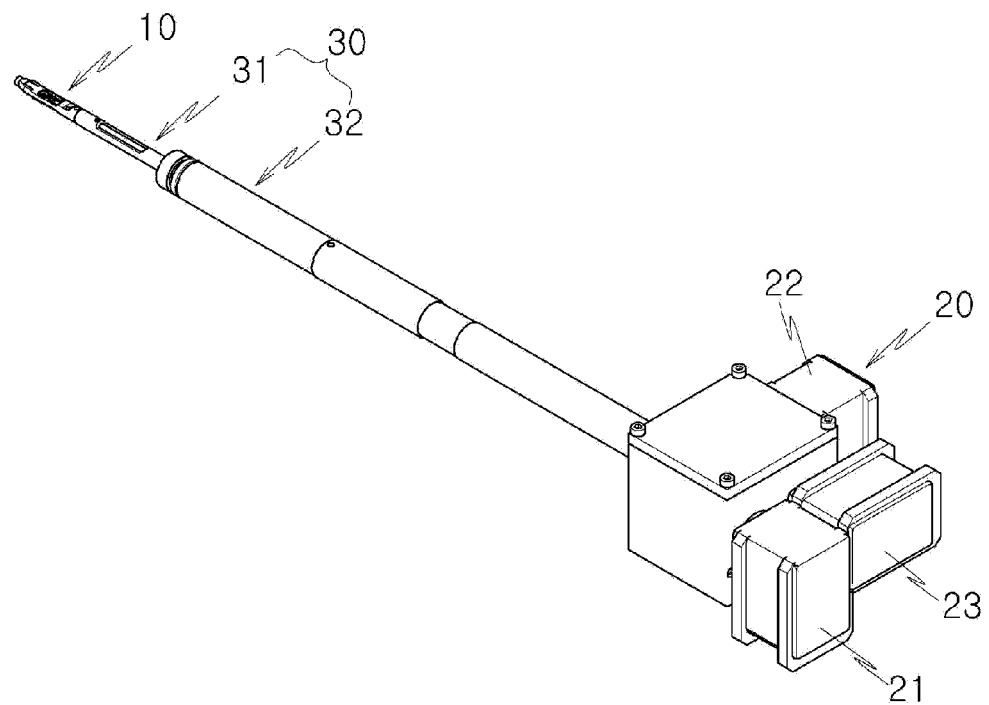
FIG. 1 is a perspective view of a specimen holder according to an embodiment of the present invention.

Reference will now be made in detail to the preferred embodiment of the present invention, examples of which are illustrated in the drawings attached hereinafter, wherein like reference numerals refer to like elements throughout. The embodiments are described below so as to explain the present invention by referring to the figures.

A specimen holder according to an embodiment of the present invention includes a holder head 10 in which a specimen is to be mounted, and a control part 20 for driving the movement of the mounted specimen. The holder head 10 includes upper and lower cradles 2 and 3 that are installed in a cradle placement hole 1a formed in a head body 1 and are configured to support the specimen, a rotation gear 4 that is installed between the upper and lower cradles 2 and 3 and is configured to rotate the upper and lower cradles 2 and 3, a rotation driving gear 5 that is welded to the rotation gear 4 and is configured to rotate the rotation gear 4, a gear cover 6 that is movably installed horizontally on the upper portion of the upper cradle 3, and a rack moving gear 62 that is welded to a rack gear 61 installed in the gear cover 6 and is configured to drive the rack gear 61 to allow the gear cover 6 to move in perpendicular to a length direction of the head body 1. The control part 20 includes a cradle rotation means 21 that is configure to rotate the rotation driving gear 5, and forward/backward moving means 22 and left/right moving means 23 that are configured to horizontally move the upper and lower cradles 2 and 3 backward, forward, leftward and rightward.

The holder head 10 allows the upper and lower cradles 2 and 3 on which the specimen is to be mounted to rotate and horizontally move, and may move in three axis (X, Y, and Z directions) at a small space through precise processing.

As illustrated in FIG. 1, the holder head 10 is connected to the control part 20 via a connection means 30. The holder head 10 can rotate the upper and lower cradles 2 and 3 by power provided from the control part 20, and horizontally move the upper and lower cradles 2 and 3.

Figure 2:
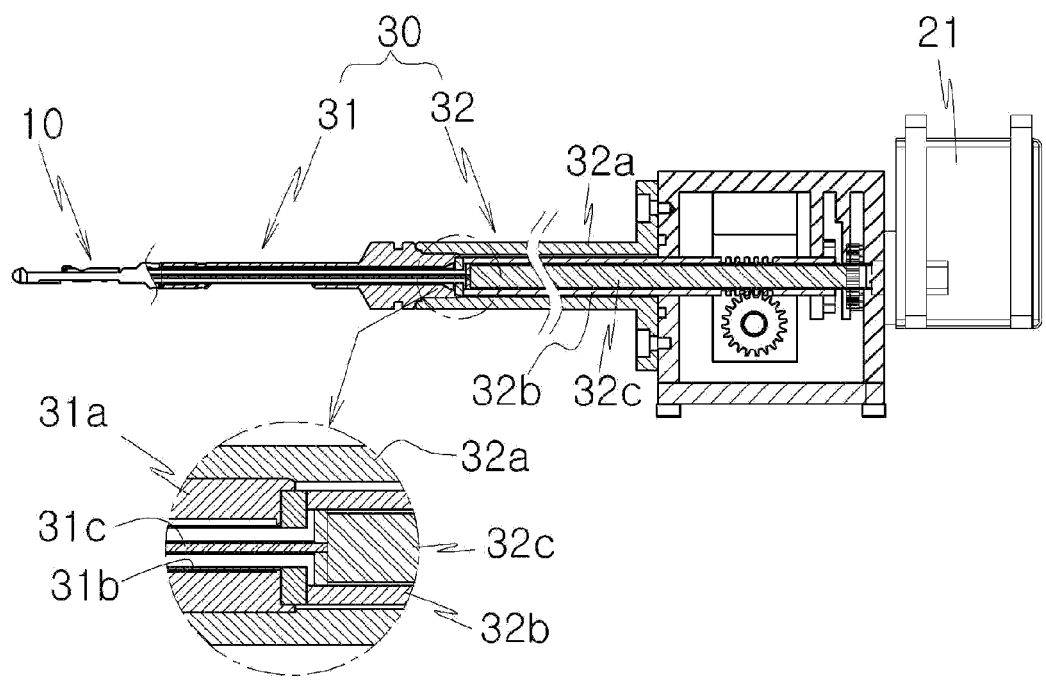
FIG. 2 is a partial cross-sectional view of a specimen holder according to an embodiment of the present invention.
Figure 3:
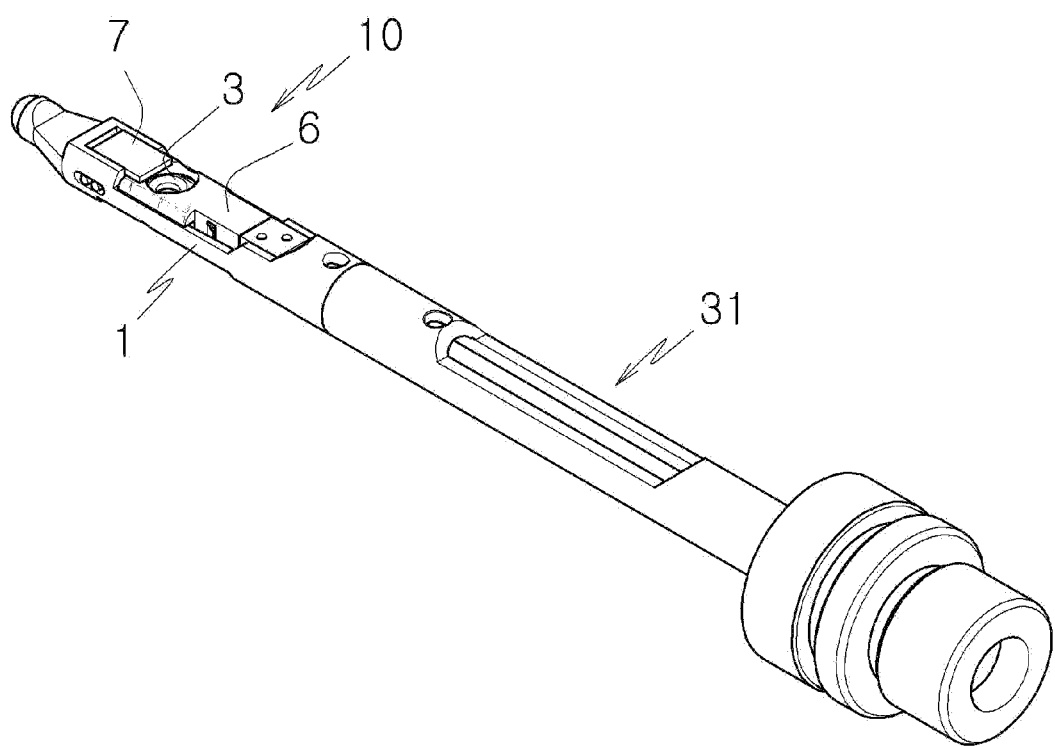
FIG. 3 is an expanded perspective view of a holder head and a connector of a specimen holder according to an embodiment of the present invention.
Figure 4:
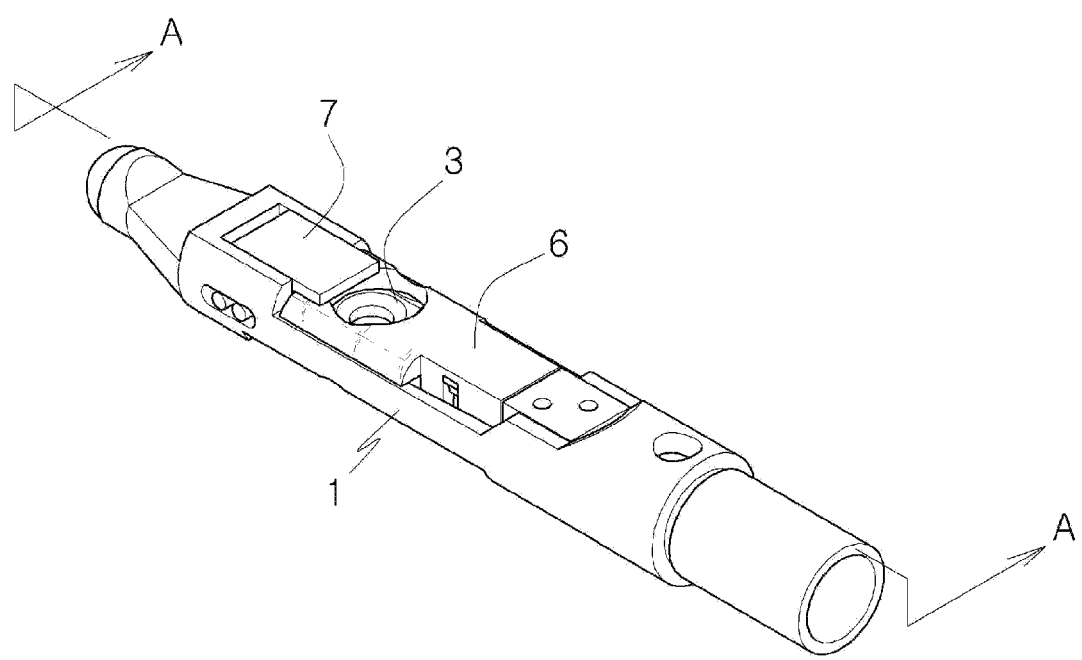
FIG. 4 is an expanded perspective view of the holder head of FIG. 3.

In an embodiment, the connection means 30 may include a holder connector 31 and a holder body 32 so as to transfer the power of the control part 20 to the holder head 10, as illustrated in FIGS. 1 and 2. The holder connector 31 and the holder body 32 may be formed by installing double axes inside circular housings 31a and 32a. That is, the holder connector 31 and the holder body 32 may include inner shafts 31c and 32c for transferring power to rotate the upper and lower cradles 2 and 3 and tubular outer tubes 31b and 32b that are installed outside the inner shafts 31c and 32c.

Figure 8:
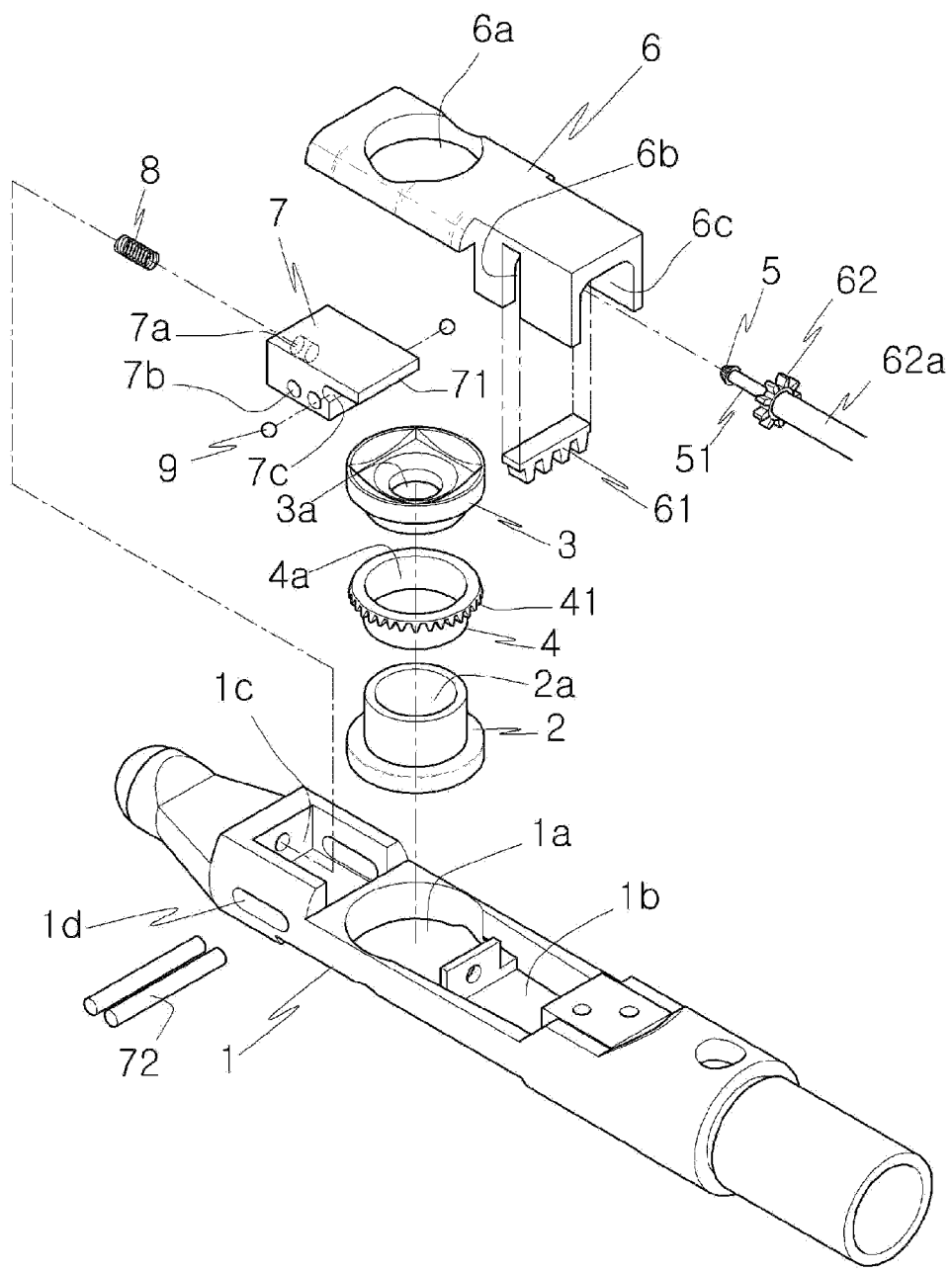
FIG. 8 is an exploded perspective view of a holder head of a specimen holder according to an embodiment of the present invention.

In more detail, as illustrated in FIG. 8, the holder head 10 includes the head body 1 that functions as a housing, and the upper and lower cradles 2 and 3 that are installed in the cradle placement hole 1a formed in the head body 1 for supporting the specimen.

As illustrated in FIG. 8, the cradle placement hole 1a formed in the holder head 10 may be formed in shape of a circle. The upper and lower cradles 2 and 3 installed in the cradle placement hole 1a may also be in shapes of columns having circular outer surfaces. More specifically, the upper and lower cradles 2 and 3 may include through holes 2a and 3a formed in the center thereof to pass through an electron beam when the specimen disposed on the upper and lower cradles 2 and 3 is observed through the TEM, and may be formed in shapes of circles to smoothly rotate. A rotation means and a horizontal moving means can be used to rotate and horizontally move the upper and lower cradles 2 and 3.

Means for rotating the upper and lower cradles 2 and 3 are the rotation gear 4 that is installed between the upper and lower cradles 2 and 3 for rotating the upper and lower cradles 2 and 3, and the rotation driving gear 5 that is welded to the rotation gear 4 for rotating the rotation gear 4.

Figure 5:
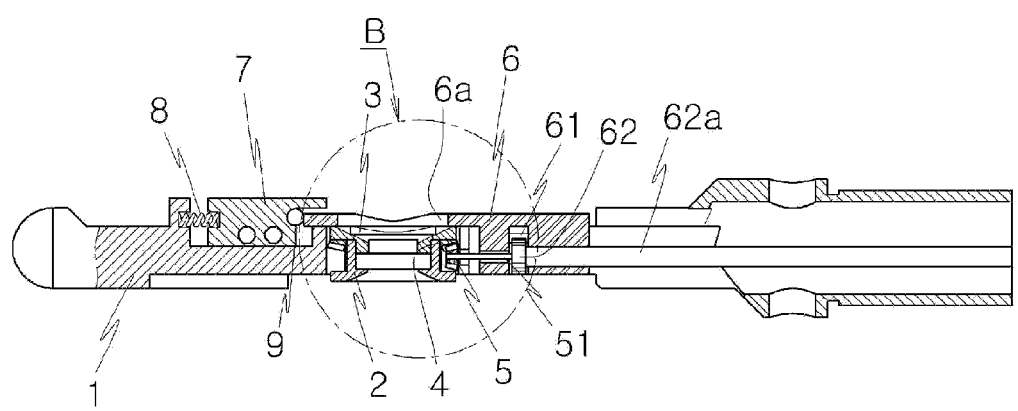
FIG. 5 is a cross-sectional view of the holder head taken from a line A-A of FIG. 4.
Figure 6:
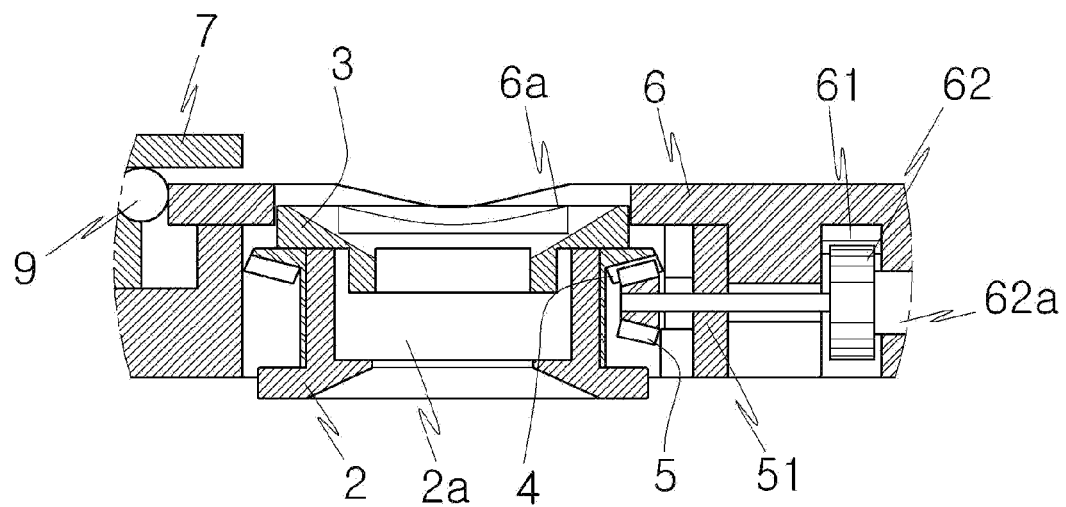
FIG. 6 is an expanded view of the part B of FIG. 5.
Figure 7:
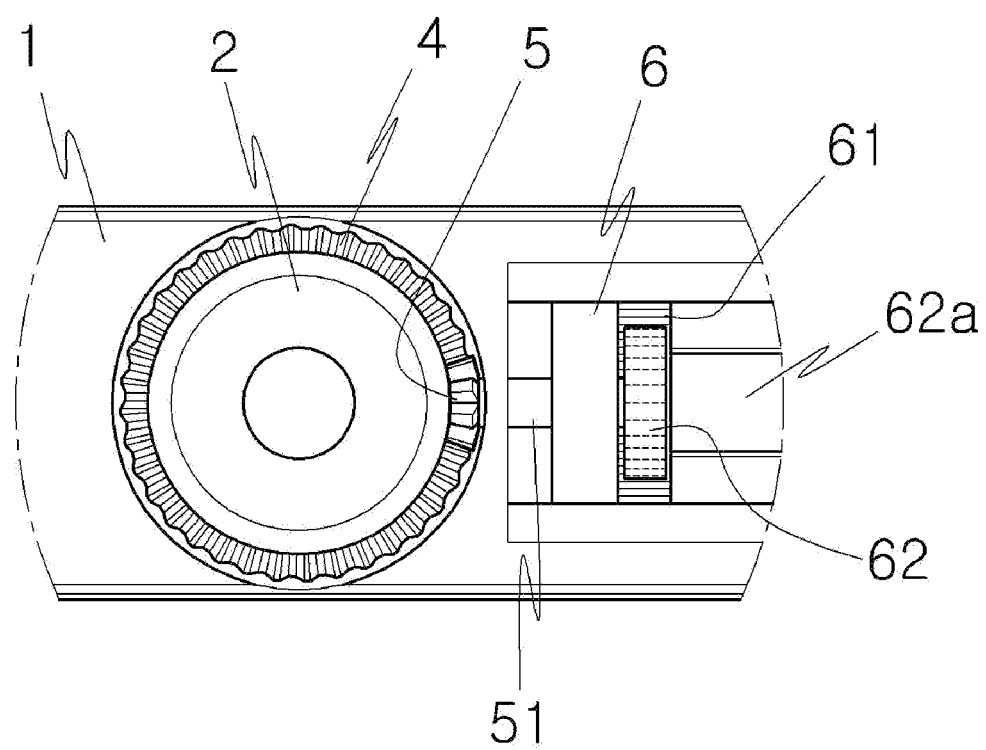
FIG. 7 is an expanded plan view of a specimen placement part of a holder head of a specimen holder according to an embodiment of the present invention.

As illustrated in FIGS. 5, 6, and 8, the rotation gear 4 is set by inserting the exterior circumferential surface of the lower cradle 2 into a hole 4a and has gear teeth 41 on the outer wall of one side end portion thereof, and the rotation driving gear 5 has gear teeth welded to the gear teeth of the rotation gear 4. The rotation driving gear 5 is driven by the power received from the control part 20. A means for transferring the power of the control part 20 to the rotation driving gear 5 is a gear rotation axis 51.

That is, the power generated from the cradle rotation means 21 included in the control part 20 is transferred to the rotation driving gear 5 through the gear rotation axis 51, and rotational centers of the rotation driving gear 5 and the rotation gear 4 are at angles with each other, and thus the rogation driving gear 5 and the rotation gear 4 may be realized as bevel gears as illustrated in FIGS. 6 and 8.

Figure 10:
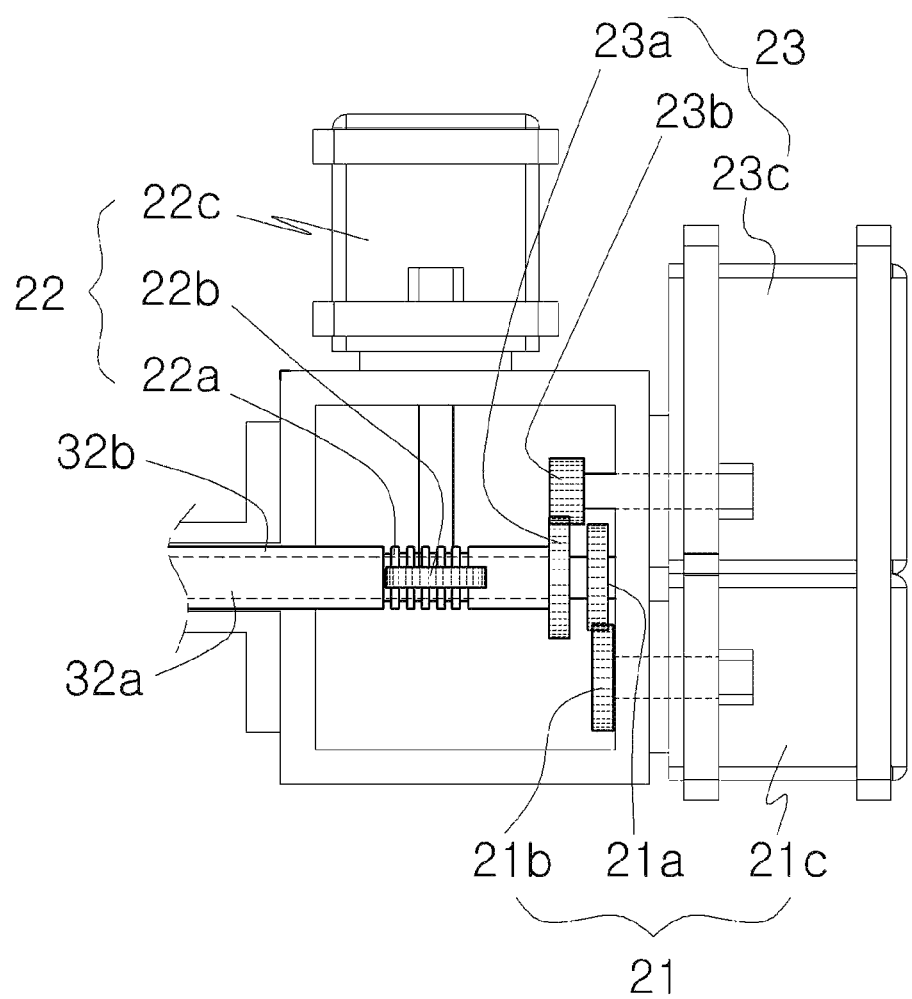
FIG. 10 is a partial plan view of a control part of a specimen holder according to an embodiment of the present invention.

As illustrated in FIG. 10, the cradle rotation means 21 includes an axis gear 21a installed in an end portion of the inner shaft 32c included in the holder body 32, and a driving motor 21c having a rotational axis on which a motor gear 21b welded to the axis gear 21a is installed. The inner shaft 32c is connected to the gear rotation axis 51 of FIG. 8 for driving the rotation driving gear 5.

As described above, the specimen placed in the upper and lower cradles 2 and 3 that rotate by the cradle rotation means 21 can move horizontally. To horizontally move the specimen, the upper cradle 3 of the upper and lower cradles 2 and 3 is movably installed horizontally. That is, as illustrated in FIG. 6, the lower portion of the upper cradle 3 has a small diameter, so that the upper cradle 3 is inserted into the through hole 2a formed in the lower cradle 2, and has an external diameter smaller than the diameter of the through hole 2a, so that the upper cradle 3 can freely move horizontally by using the horizontal moving means.

Means for horizontally moving the upper cradle 3 includes the gear cover 6 that is movably installed horizontally on the upper portion of the upper cradle 3, and the rack moving gear 62 that is welded to the rack gear 61 installed in the gear cover 6 for driving the rack gear 61 to allow the gear cover 6 to move in perpendicular to the length direction of the head body 1. The rack driving gear 62 is driven by power received from the left and right moving means 23 included in the control part 20.

Figure 9:
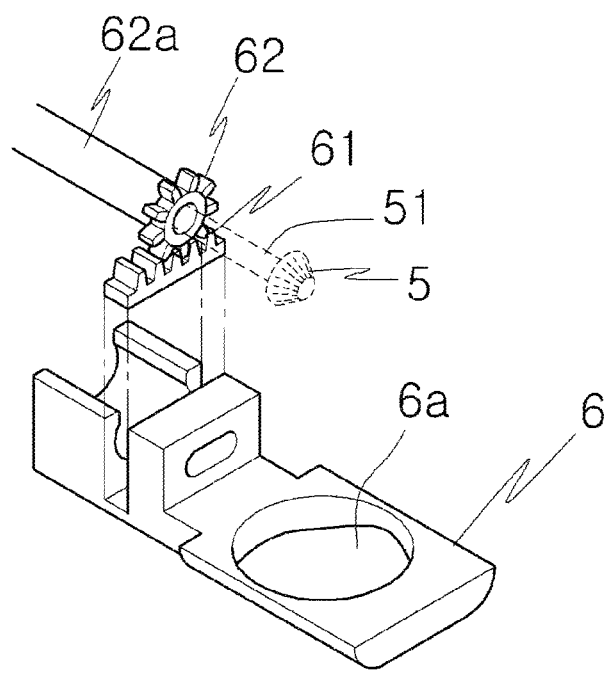
FIG. 9 is a bottom surface exploded perspective view of a gear cover and a moving means thereof of a specimen holder according to an embodiment of the present invention.

As illustrated in FIGS. 8 and 9, the gear cover 6 is bent in the shape of "⌐", and has a specimen through hole 6a formed in a horizontal portion thereof. A diameter of the specimen through hole 6a is the same as or slightly smaller than an exterior diameter of the upper cradle 3, and thus the upper cradle 3 is inserted into the specimen through hole 6a (refer to FIG. 6).

The rack gear 61 can be integrally formed in the middle of a vertical portion of the gear cover 6 or, as illustrated in FIGS. 8 and 9, a gear installation groove 6b can be formed and the rack gear 61 can be detachably installed in the gear installation groove 6b.

The lower part of the gear cover 6 is inserted to the inside of the cover moving hole 1b formed on head body 1 so as to move horizontally.

An axis through hole 6c through which a rack gear driving axis 62a in which the rack driving gear 62 is installed passes is formed in the gear cover 6 in an axial direction.

As illustrated in FIG. 10, the left and right moving means 23 includes an axis gear 23a installed in one side end portion of the outer tube 32b included in the holder body 32, and a driving motor 23c in which the motor gear 23b welded to the axis gear 23a is installed. The outer tube 32b is connected to the rack gar driving axis 62a in which the rack driving gear 62 illustrated in FIGS. 5 through 8 is installed. The rack gear driving axis 62a is in a shape of a cylindrical pipe through which the gear rotation axis 51 passes.

A direction of the gear cover 6 that moves by operating the rack driving gear 62 and the rack gear 61 by the left and right moving means 23 described above is perpendicular to an axis. A means for moving the gear cover 6 in the length direction of the axis is the back and forth moving means 22 included in the control part 20.

Figure 11:
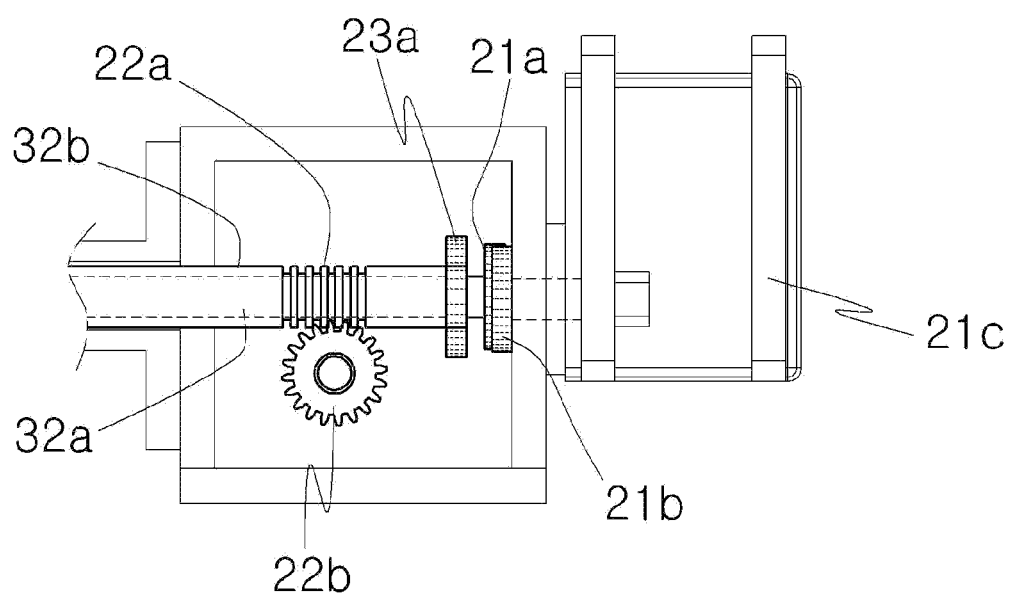
FIG. 11 is a side view of a control part of a specimen holder according to an embodiment of the present invention.

As illustrated in FIGS. 10 and 11, the back and forth moving means 22 includes a rack 22a installed in one side end portion of the outer tube 32b included in the holder body 32 in a length direction thereof, and a driving motor 22c having a pinion 22b welded to gear teeth of the rack 22a. The outer tube 32b is connected to the rack gear driving axis 62a so that the rack 22a moves in an axial direction thereby causing the gear cover 6 to move and the upper cradle 3 inserted into the center of the gear cover 6 to move in the axial direction.

Another example of the back and forth moving means 22 may be a piezo actuator (not shown) that is installed in one side end portion of the outer tube 32b, extends according to supplied electricity, and is configured to move the outer tube 32b.

As described above, the gear cover 6 that can horizontally move according to the back and forth and left and right moving means 22 and 23 is bent in the shape of "⌐", and is supported by the head body 1 since the gear rotation axis 51 passes through a vertical portion of the gear cover 6. On the other hand, a horizontal portion thereof has no support means in a free end portion thereof, ad the gear cover 6 can be spaced apart from the head body 1. Thus, a support means to prevent the gear cover 6 from being spaced apart from the head body 1 is necessary. Such a support means is a cover support holder 7.

As illustrated in FIG. 8, the cover support holder 7 is installed to horizontally move into a support holder installation groove 1c formed in one side of the cradle placement groove 1a of the head body 1. A hook projection 71 onto which the free end portion of the gear cover 6 is hooked is formed on an upper end of a surface of the cover support holder 7 facing the gear cover 6, and a spring 8 is installed in a spring fixing groove 7a formed in a surface that is opposite to the surface of the cover support holder 7, and thus the cover support holder 7 is pushed toward the gear cover 6 and elastically supports the free end portion of the gear cover 6.

Further, a ball 9 is installed in a ball placement hole 7c formed in a lower portion of the hook projection 71, and is used to minimize a friction force between the cover support holder 7 and the gear cover 6 when the gear cover 6 moves in left and right directions, i.e., directions in perpendicular to the axis.

Also, the cover support holder 7 must move in a direction toward the gear cover 6 as described above. To horizontally move the cover support holder 7, as illustrated in FIG. 8, a coupling pin sliding hole 1d is lengthily formed to pass through the side wall of the head body 1, a pin through hole 7b is formed in the cover support holder 7, and both end portions of a coupling pin 72 inserted into the pin through hole 7b can move back and forth inside the coupling pin sliding hole 1d.

When the specimen holder constructed as described above is tilted to an element in which an observation specimen is mounted in the center of the upper cradle 3 installed in the holder head 10, an inner surface of the specimen holder is tilted at about 60° with respect to a center axis to reduce an interference of an electron beam, and a rectangular groove is formed in a top surface of the specimen holder to facilitate attachment and detachment of the specimen when the specimen is mounted.

An assembling sequence of the specimen holder according to an embodiment of the present invention constructed as described above will now be described.

The holder head 10 is assembled as follows.

1. The gear rotation axis 51 and the rack gear driving axis 62a are installed in a pivot hole formed in the head body 1 of the holder head 10 in a length direction. The gear rotation axis 51 is installed through the center of the rack gear driving axis 62a. The rotation driving gear 5 and the rack driving gear 61 are installed in the gear rotation axis 51 and the rack gear driving axis 62a, respectively. The gear rotation axis 51 and the rack gear driving axis 62a are bonded to the rotation driving gear 5 and the rack driving gear 61.

2. The rotation gear 4 is inserted into the outer circumferential surface of the lower cradle 2, and the upper cradle 3 is inserted into the through hole 2a formed in the center of the lower cradle 2.

3. The cradle assembly is assembled to the cradle placement hole 1a formed in the head body 1.

4. The rack gear 61 installed in the rear end of the gear cover 6 and the rack driving gear 62 are engaged with each other. The gear cover 6 is installed in an upper portion of the cradle assembly when a gear formed in the rotation gear 4 is engaged with the rotation driving gear 5. In this regard, the gear cover 6 cannot be separated from the head body 1 by installing a fixing plate in a bottom surface of the gear cover 6.

5. The spring 8 is inserted into the spring fixing groove 7a formed in the cover support holder 7, the cover support holder 7 is inserted into the support holder installation groove 1c formed in the head body 1, and the coupling pin 72 is fixed through the coupling pin sliding hole 1d and the pin through hole 7b.

The holder head 10 assembled as described above is then connected to the holder connector 31. The holder connector 31 is connected to the holder body 32. The holder body 32 is connected to the control part 20. The housings 31a and 32a included in the holder connector 31 and the holder body 32, the outer tubes 31b and 32b, and the inner shafts 31c and 32c are connected to each other. The outer tube 31b included in the holder connector 31 is connected to the rack gear driving axis 62a included in the holder head 10. The inner shaft 31c is connected to the gear rotation axis 51.

In this regard, after the holder connector 31, the holder body 32, and the holder head 10 are assembled together such that the gear rotation axis 51 and the rack gear driving axis 62a are not pushed toward the holder head 10. If an excessive torque is received during an initial setting, since the rack gear driving axis 62a and the tubular outer tubes 31b and 32b or gear bonding portions can be changed, the initial setting is made at a small amount of rotations.

A process of moving the specimen holder constructed as described above is performed as below.

1. Before moving the specimen holder, it is confirmed whether a portion of the holder head 10 that is to mechanically generate a friction contains impurities and is coated with a proper amount of vacuum grease.

2. A specimen manufactured only for a TEM is mounted in the lower and upper cradles 2 and 3 included in the holder head 10.

3. The specimen holder in which the specimen is mounted is inserted into the TEM.

4. A control cable is connected to the control part 20 and a driving control computer (not shown).

5. A motor driving program of the control computer is used to control driving of the three driving motors 11c, 22c, and 23c and search for an observation object from a low magnification.

6. If the observation object is determined, the back and forth moving means 22 and the left and right moving means 23 are driven to move the lower and upper cradles 2 and 3 so that the specimen is moved within the field of vision of the TEM.

7. The TEM is precisely controlled to allow the specimen to stay within the field of vision of the TEM while controlling the TEM from the low magnification to a high magnification.

8. An experiment is carried out after confirming that the specimen stays within the field of vision of the TEM at the high magnification.

9. The specimen is observed by using only the three driving motors 11c, 22c, and 23c and a goniometer (TEM column).

The specimen holders of according to embodiments of the present invention constructed as described above use a gear cover to horizontally move cradles included in a conventional double tilt holder or a conventional rotation holder so that a specimen is always disposed within the field of view of a TEM, and thereby easier and more accurate observation and analysis of the specimen is possible.

In particular, a gear cover for horizontally moving the cradle is installed in one side of the cradle included in a conventional double tilt holder or a rotation holder. The cradle horizontally moves by moving the gear cover back and forth and left and right so that the specimen disposed on the cradle could be rotates or tilted within the field of view of the TEM. The specimen is observed and analyzed in different orientations, thereby one can perform more accurate analysis of the specimen in 3D.

While the present invention has been particularly shown and described with reference to exemplary embodiments thereof, it will be understood by those of ordinary skill in the art that various changes in form and details may be made therein without departing from the spirit and scope of the invention as defined by the appended claims. The exemplary embodiments should be considered in a descriptive sense only and not for purposes of limitation.

What is claimed is:

1. A specimen holder capable of a 3-axis movement for a 3D analysis of a transmission electron microscope (TEM), the specimen holder comprising:
    a holder head in which a specimen is to be mounted; and
    a control part that is configured to move the mounted specimen,
    wherein the holder head comprises:
    upper and lower cradles that are installed in a cradle placement hole formed in a head body of the holder head and are configured to support the specimen;
    a rotation gear that is installed between the upper and lower cradles and is configured to rotate the upper and lower cradles;
    a rotation driving gear that is welded to the rotation gear and is configured to rotate the rotation gear;
    a gear cover that is movably installed horizontally on the upper portion of the upper cradle; and
    a rack moving gear that is welded to a rack gear installed in the gear cover and is configured to drive the rack gear to thereby allow the gear cover to move in perpendicular to a length direction of the head body,
    wherein the control part comprises:
    a cradle rotation means that is configured to rotate the rotation driving gear; and
    back and forth and left and right moving means that horizontally move the upper and lower cradles.

2. The specimen holder of claim 1, wherein the holder head and the control part are connected to each other via a connection means,
    wherein the connection means comprises: a holder connector connected to the head body, and a holder body connected between the holder connector and the control part,
    wherein the holder connector and the holder body comprise:
    two outer tubes that are installed in two housings and connected to an axis of the back and forth and left and right moving means; and
    two inner shafts that are installed in the outer tubes, connected to an axis of the cradle rotation means, and is configured to transfer power to the rotation driving gear.

3. The specimen holder of claim 1, wherein the gear cover installed in the head body is supported by a cover support holder that is elastically supported by a spring.

4. The specimen holder of claim 3, wherein a friction prevention hole is installed in an end portion where the cover support holder and the gear cover face each other.

5. The specimen holder of claim 4, wherein the cradle rotation means comprises:
    an axis gear that is installed in an end portion of the inner shaft; and
    a driving motor having a rotation axis in which a motor gear welded to the axis gear is installed.

6. The specimen holder of claim 5, wherein the left and right moving means comprises:
    an axis gear that is installed in one side end portion of the outer tube; and
    a driving motor having a rotation axis in which a motor gear welded to the axis gear is installed.

7. The specimen holder of claim 6, wherein the back and forth moving means comprises:
    a rack that is installed in one side end portion of the outer tube in a length direction of the outer tube; and
    a driving motor in which a pinion welded to gear teeth of the rack is installed.

8. The specimen holder of claim 6, wherein the back and forth moving means is a piezo actuator that is installed in one side end portion of the outer tube, extends by electricity, and is configured to move the outer tube.

9. The specimen holder of claim 2, wherein the gear cover installed in the head body is supported by a cover support holder that is elastically supported by a spring.

10. The specimen holder of claim 9, wherein a friction prevention hole is installed in an end portion where the cover support holder and the gear cover face each other.

11. The specimen holder of claim 10, wherein the cradle rotation means comprises:
    an axis gear that is installed in an end portion of the inner shaft; and
    a driving motor having a rotation axis in which a motor gear welded to the axis gear is installed.

12. The specimen holder of claim 11, wherein the left and right moving means comprises:
- an axis gear that is installed in one side end portion of the outer tube; and
- a driving motor having a rotation axis in which a motor gear welded to the axis gear is installed.

13. The specimen holder of claim 12, wherein the back and forth moving means comprises:
- a rack that is installed in one side end portion of the outer tube in a length direction of the outer tube; and
- a driving motor in which a pinion welded to gear teeth of the rack is installed.

14. The specimen holder of claim 12, wherein the back and forth moving means is a piezo actuator that is installed in one side end portion of the outer tube, extends by electricity, and is configured to move the outer tube.

* * * * *